(12) United States Patent
Chung (10) Patent No.: US 8,351,252 B2
(45) Date of Patent: Jan. 8, 2013

(54) DATA READ CIRCUIT FOR PHASE CHANGE MEMORY DEVICE AND APPARATUSES INCLUDING THE SAME

(75) Inventor: Hoe Ju Chung, Yongin-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 238 days.

(21) Appl. No.: 12/875,332

(22) Filed: Sep. 3, 2010

(65) Prior Publication Data

US 2011/0103140 A1 May 5, 2011

(30) Foreign Application Priority Data

Oct. 29, 2009 (KR) .................. 10-2009-0103476

(51) Int. Cl.
*G11C 11/00* (2006.01)
(52) U.S. Cl. ... 365/163; 365/148; 365/207; 365/189.15; 365/189.011; 365/189.09; 365/211
(58) Field of Classification Search .................. 365/163, 365/148, 207, 189.15, 189.011, 189.09, 211
See application file for complete search history.

(56) References Cited

U.S. PATENT DOCUMENTS

| 6,628,558 | B2 | 9/2003 | Fiscus |
| 6,700,814 | B1 | 3/2004 | Nahas et al. |
| 7,277,343 | B1 | 10/2007 | So et al. |
| 2002/0196692 | A1 | 12/2002 | Fiscus |
| 2007/0216777 | A1 * | 9/2007 | Quan et al. .................. 348/222.1 |
| 2007/0217254 | A1 * | 9/2007 | Matsuoka et al. ............. 365/163 |
| 2007/0236987 | A1 * | 10/2007 | Cho et al. ........................ 365/163 |
| 2008/0025111 | A1 * | 1/2008 | Choy et al. ............... 365/189.09 |
| 2010/0124136 | A1 * | 5/2010 | Ho et al. ......................... 365/211 |
| 2010/0290280 | A1 * | 11/2010 | Seo et al. ........................ 365/171 |

FOREIGN PATENT DOCUMENTS
KR 10-0809334 2/2008

* cited by examiner

*Primary Examiner* — Fernando Hidalgo
(74) *Attorney, Agent, or Firm* — Harness, Dickey & Pierce, P.L.C.

(57) ABSTRACT

The data read circuit includes a variable current generation circuit and a data sensing circuit. The variable current generation circuit is configured to generate a variable current that varies in response to an external temperature. The data sensing circuit is configured to sense and amplify data on a bit line connected to a non-volatile memory cell according to the variable current and to configured to output the sensed and amplified data. The data sensing circuit controls a margin for sensing the data according to the variable current.

20 Claims, 8 Drawing Sheets

| | 1-1 | 1-2 | 1-3 | 1-4 | 1-5 | 1-6 | 1-7 | 1-8 |
|---|---|---|---|---|---|---|---|---|
| | BLK7 | BLK7 | BLK7 | BLK7 | BLK7 | BLK7 | BLK7 | BLK7 |
| | BLK6 | BLK6 | BLK6 | BLK6 | BLK6 | BLK6 | BLK6 | BLK6 |
| | BLK5 | BLK5 | BLK5 | BLK5 | BLK5 | BLK5 | BLK5 | BLK5 |
| | BLK4 | BLK4 | BLK4 | BLK4 | BLK4 | BLK4 | BLK4 | BLK4 |
| | BLK3 | BLK3 | BLK3 | BLK3 | BLK3 | BLK3 | BLK3 | BLK3 |
| | BLK2 | BLK2 | BLK2 | BLK2 | BLK2 | BLK2 | BLK2 | BLK2 |
| | BLK1 | BLK1 | BLK1 | BLK1 | BLK1 | BLK1 | BLK1 | BLK1 |
| | BLK0 | BLK0 | BLK0 | BLK0 | BLK0 | BLK0 | BLK0 | BLK0 |
| | RD2_1 | | RD2_2 | | RD2_3 | | RD2_4 | |
| | PERI3 | | | | | | | |
| | RD2_8 | | RD2_7 | | RD2_6 | | RD2_5 | |
| | BLK7 | BLK7 | BLK7 | BLK7 | BLK7 | BLK7 | BLK7 | BLK7 |
| | BLK6 | BLK6 | BLK6 | BLK6 | BLK6 | BLK6 | BLK6 | BLK6 |
| | BLK5 | BLK5 | BLK5 | BLK5 | BLK5 | BLK5 | BLK5 | BLK5 |
| | BLK4 | BLK4 | BLK4 | BLK4 | BLK4 | BLK4 | BLK4 | BLK4 |
| | BLK3 | BLK3 | BLK3 | BLK3 | BLK3 | BLK3 | BLK3 | BLK3 |
| | BLK2 | BLK2 | BLK2 | BLK2 | BLK2 | BLK2 | BLK2 | BLK2 |
| | BLK1 | BLK1 | BLK1 | BLK1 | BLK1 | BLK1 | BLK1 | BLK1 |
| | BLK0 | BLK0 | BLK0 | BLK0 | BLK0 | BLK0 | BLK0 | BLK0 |
| | 1-16 | 1-15 | 1-14 | 1-13 | 1-12 | 1-11 | 1-10 | 1-9 |

DATA READ CIRCUIT FOR PHASE CHANGE MEMORY DEVICE AND APPARATUSES INCLUDING THE SAME

CROSS-REFERENCE TO RELATED APPLICATION(S)

This application claims priority under 35 U.S.C. §119 to Korean Patent Application No. 10-2009-0103476, filed on Oct. 29, 2009, in the Korean Intellectual Property Office (KIPO), the entire contents of which are incorporated herein by reference.

BACKGROUND

1. Field

Example embodiments of the present invention relate to a semiconductor memory device, for example, to a data read circuit for increasing the reliability of a read operation in a phase change memory and apparatuses including the same.

2. Description of Related Art

Phase change memory may be formed from a phase change material such as a chalcogenide alloy, which maintains one of two states once cooled after being heated and is changeable between the two states through heating and cooling. The two states are a crystalline state and an amorphous state. The phase change material has a low resistance in the crystalline state and has a high resistance in the amorphous state. The crystalline state is referred to as a "set" state and corresponds to data "0". The amorphous state is referred to as a "reset" state and corresponds to data "1".

In a read operation of a phase change memory device, a phase change memory cell to be read is selected from among a plurality of phase change memory cells. When current is supplied to the selected phase change memory cell, a current depending on the resistance of a phase change material is generated. A sense amplifier of a read circuit included in the phase change memory device compares a voltage level changed by the current at a sensing node with a reference voltage level to identify data "0" or data "1".

SUMMARY

Example embodiments of the present invention provide a read circuit for increasing the reliability of a read operation in a phase change memory device, a phase change memory device including the read circuit, and a memory system including the phase change memory device.

According to example embodiments, a data read circuit includes a variable current generation circuit and a data sensing circuit. The variable current generation circuit is configured to generate a variable current that varies in response to an external temperature. The data sensing circuit is configured to sense and amplify data on a bit line connected to a non-volatile memory cell according to the variable current and to configured to output the sensed and amplified data. The data sensing circuit controls a margin for sensing the data according to the variable current.

In example embodiments, the variable current generation circuit is configured to generate the variable current in proportion to the external temperature.

In example embodiments, the data sensing circuit includes a clamping circuit connected between the bit line and a sensing node to provide a clamping voltage having a threshold voltage level to the bit line in response to a clamp signal and a sense amplifier configured to compare a voltage level of the sensing node with a reference voltage level and configured to sense and amplify the data on the bit line.

In example embodiments, the variable current generation circuit provides the variable current to the sensing node during a read operation such that the sense amplifier secures the margin for sensing the data between a voltage level of the sensing node in a reset state and a voltage level of the sensing node in a set state.

In example embodiments, the sense amplifier is configured to sense at least one of a voltage difference between the voltage level of the sensing node in the reset state and the reference voltage level and a voltage difference between the voltage level of the sensing node in the set state and the reference voltage level.

In example embodiments, the data read circuit includes a precharge circuit configured to charge the sensing node to a precharge voltage level during a precharge operation preceding the read operation.

In example embodiments, the clamping circuit includes a transistor.

In example embodiments, the non-volatile memory cell includes at least one phase change memory cell.

According to example embodiments, a semiconductor device includes a non-volatile memory cell connected to a word line and a bit line and a data read circuit configured to read data on the bit line. The data read circuit includes a variable current generation circuit configured to generate a variable current that varies in response to an external temperature, and a data sensing circuit configured to sense and amplify the data on the bit line connected to the non-volatile memory cell according to the variable current and configured to output sensed and amplified data. The data sensing circuit controls a margin for sensing the data according to the variable current.

According to example embodiments, a semiconductor memory system includes a semiconductor device and a processor configured to control operations of the semiconductor device. The semiconductor device includes a non-volatile memory cell connected to a word line and a bit line and a data read circuit configured to read data on the bit line. The data read circuit includes a variable current generation circuit configured to generate a variable current that varies in response to an external temperature and a data sensing circuit configured to sense and amplify the data on the bit line connected to the non-volatile memory cell according to the variable current and configured to output the sensed and amplified data. The data sensing circuit controls a margin for sensing the data according to the variable current.

In example embodiments, the semiconductor memory system further includes an image sensor configured to convert an optical signal into a digital data signal, wherein the processor is configured to store the digital data signal in the non-volatile memory cell included in the semiconductor device.

In example embodiments, the semiconductor memory system further includes a card interface, wherein the processor is configured to control the sensed and amplified data output from the data sensing circuit to be transmitted externally through the card interface.

BRIEF DESCRIPTION OF THE DRAWINGS

The above and other features and advantages will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

FIG. 1 is a block diagram of a semiconductor memory device according to example embodiments of the present invention.

DETAILED DESCRIPTION

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

Spatially relative terms, such as "at least one of," "below," "selected," "a part of," "remaining," "around," "over," "lower portion," and the like, may be used herein for ease of description to describe one element or feature's relationship to another element(s) or feature(s) as illustrated in the figures. The terminology used herein is for the purpose of describing example embodiments only and is not intended to be limiting of the present invention. The accompanying figures are not to be considered as drawn to scale unless explicitly noted The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Figure 1:
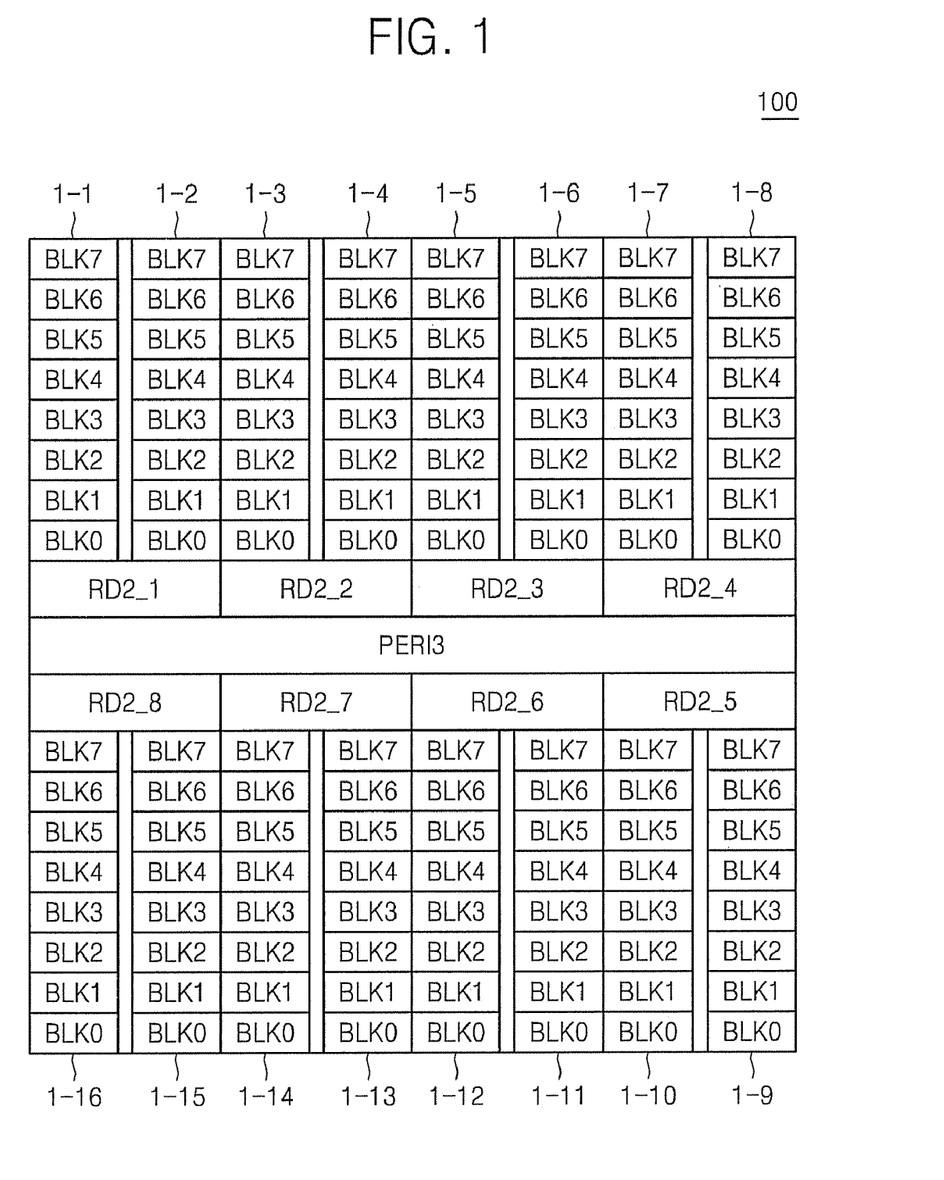

FIG. 1 is a block diagram of a semiconductor memory device 1 according to example embodiments of the present invention. For clarity of description, a phase change memory device 100 including 16 memory banks 1-1 to 1-16 is exemplified as the semiconductor memory device 1 in FIG. 1, but example embodiments of the present invention are not restricted thereto.

The phase change memory device 100 includes a memory cell array, a plurality of read circuits RD2_1 through RD2_8, and a peripheral circuit area PERI3. The memory cell array includes a plurality of memory banks 1-1 through 1-16 each including a plurality of memory blocks BLK0 through BLK7. Each of the memory blocks BLK0 through BLK7 includes a plurality of phase change memory cells arranged in a matrix faun.

Although eight memory blocks BLK0 through BLK7 are illustrated in FIG. 1, the present invention is not restricted thereto. Here, each phase change memory cell may include a variable resistance element, which includes a phase change material having two different resistances respectively corresponding to a crystalline state and an amorphous state, and a diode or a transistor connected in series with the variable resistance element.

The phase change material may at least be a compound of two elements such as GaSb, InSb, InSe, Sb2Te3, or GeTe, a compound of three elements such as GeSbTe, GaSeTe, InSbTe, SnSb2Te4, or InSbGe, or a compound of four elements such as AgInSbTe, (GeSn)SbTe, GeSb(SeTe), or Te81Ge15Sb2S2. Of these compounds, GeSbTe, composed of germanium (Ge), antimony (Sb), and tellurium (Te) may be usually used. Although not shown, the phase change memory device 100 includes a row selection circuit (or row decoder) and a column selection circuit (or column decoder) to select phase change memory cells included in the memory banks 1-1 through 1-16.

Each of the read circuits RD2_1 through RD2_8 performs a read operation in two memory banks, e.g., 1-1 and 1-2 or 1-3 and 1-4, among the plurality of the memory banks 1-1 through 1-16. Although each of the read circuits RD2_1 through RD2_8 corresponds to two memory banks in the embodiments illustrated in FIG. 1, each of the read circuits RD2_1 through RD2_8 may be implemented to correspond to one memory bank or a plurality of memory banks, according to example embodiments of the present invention.

Figure 2:
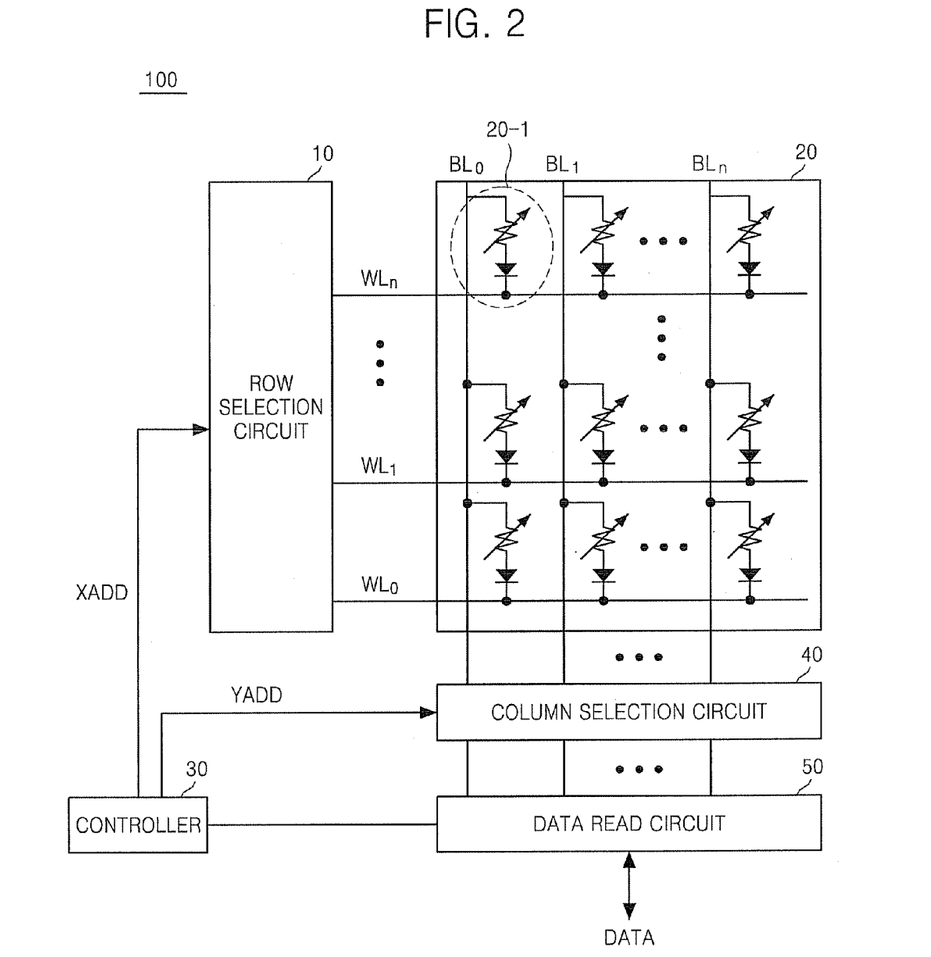
FIG. 2 is a circuit diagram of the semiconductor memory device illustrated in FIG. 1.

FIG. 2 is a circuit diagram of the semiconductor memory device 100 illustrated in FIG. 1. Referring to FIG. 2, the semiconductor memory device 100 includes a row selection circuit 10, a memory cell array 20 including at least one of the plurality of memory banks 1-1 through 1-16, a column selection circuit 40, a data read circuit 50 including at least one of the plurality of read circuits RD2_1 through RD2_8, and a controller 30.

The row selection circuit 10 decodes row addresses XADD output from the controller 30 and selects one word line from among the plurality of word lines WL0 through WLn, where n is a natural number. The memory cell array 20 includes the word lines WL0 through WLn, a plurality of bit lines BL0 through BLn, and a plurality of non-volatile memory cells, for example phase change memory cells 20-1 connected between the word lines WL0 through WLn and the bit lines BL0 through BLn. The column selection circuit 40 decodes column addresses YADD output from the controller 30 and selects at least one bit line from among the bit lines BL0 through BLn.

In a read operation, for instance, a phase change memory cell 20-1 to be read is selected by the row selection circuit 10 and the column selection circuit 40. The data read circuit 50 supplies current to the selected phase change memory cell 20-1, senses the change in a voltage level of a sensing node, which occurs due to current flowing through the phase change memory cell 20-1, and reads data DATA stored in the selected phase change memory cell 20-1.

Figure 3:
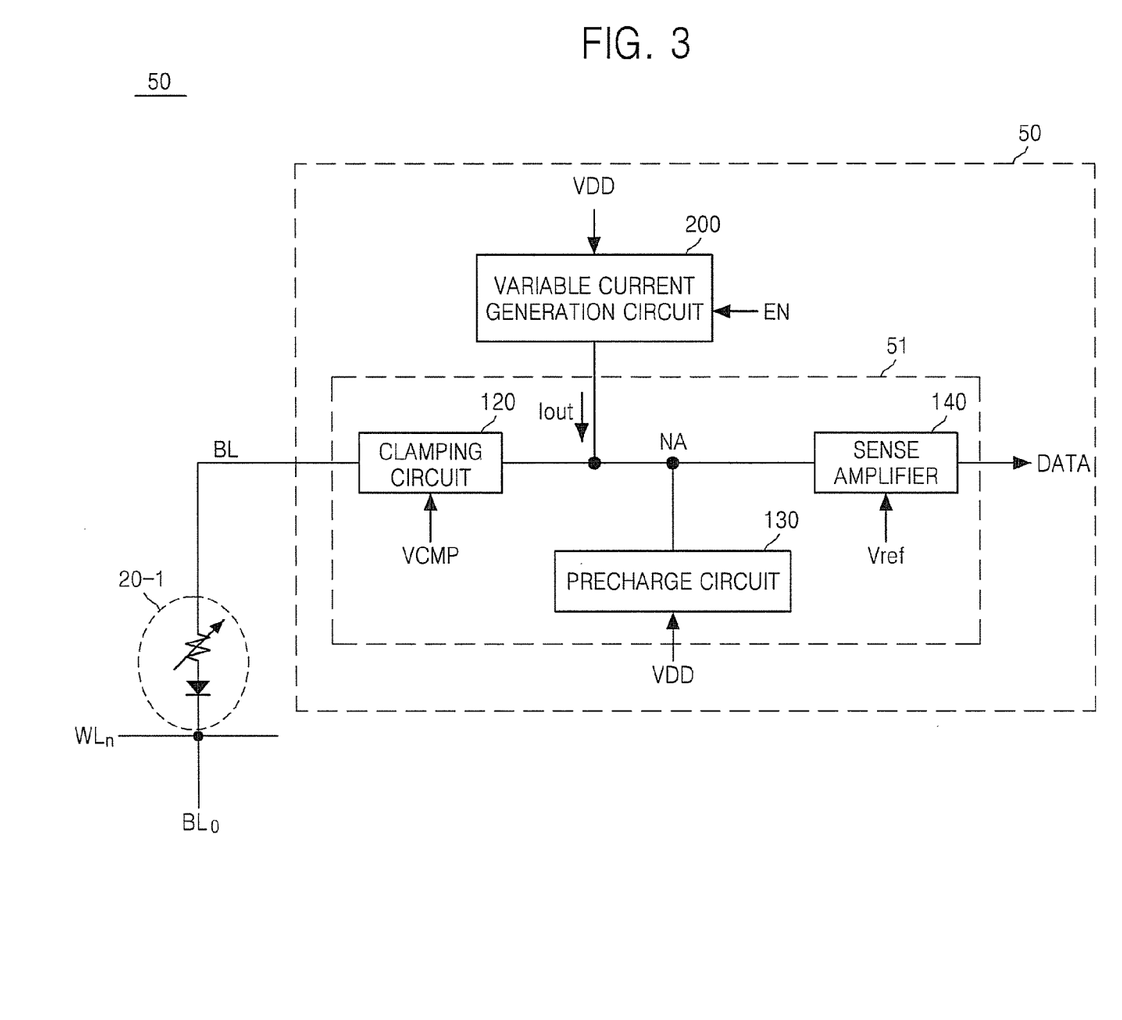
FIG. 3 is a block diagram of a read circuit illustrated in FIG. 2.
Figure 4:
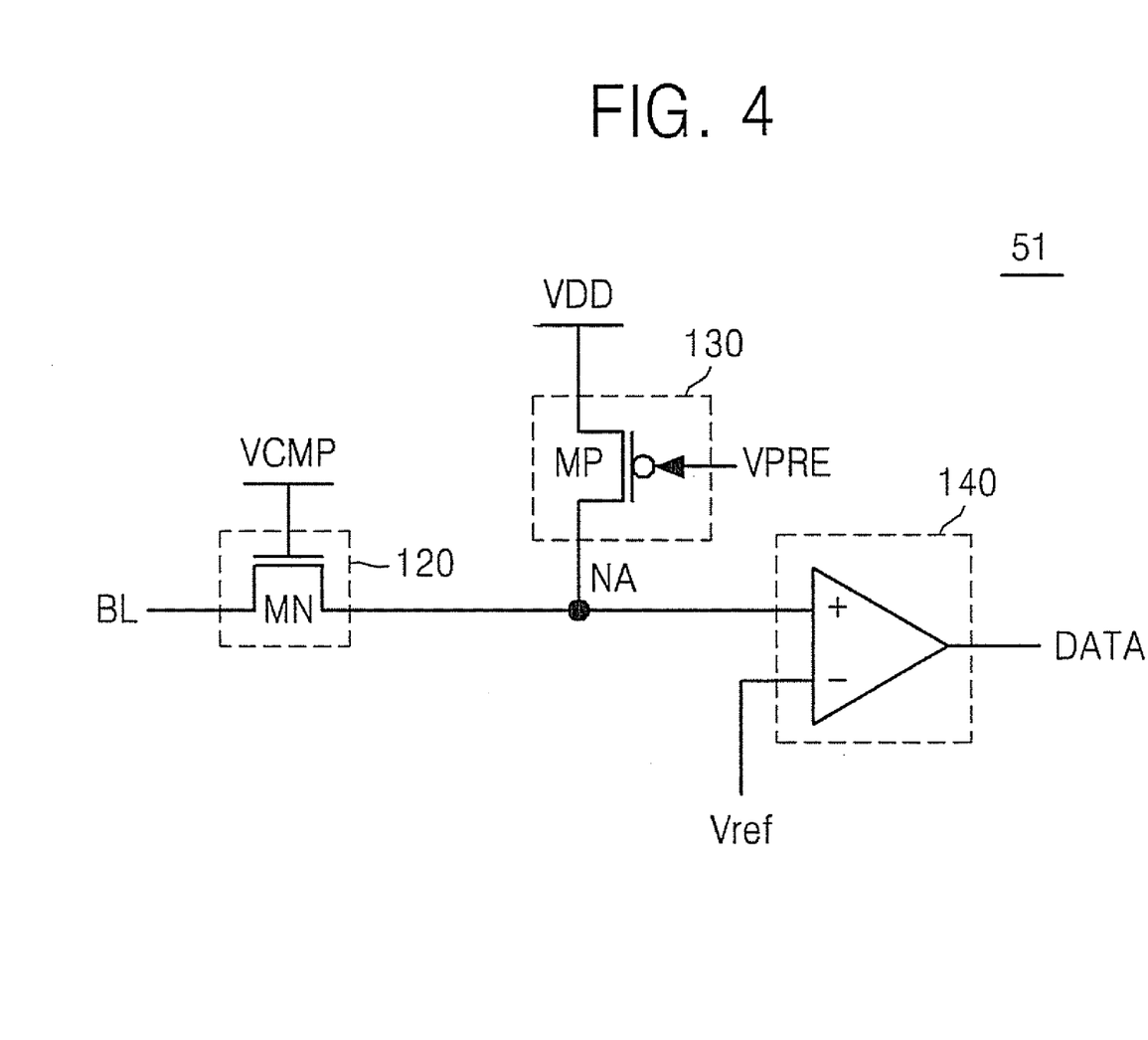
FIG. 4 is a circuit diagram of a read data sensing circuit illustrated in FIG. 3.

FIG. 3 is a block diagram of the data read circuit 50 illustrated in FIG. 2. FIG. 4 is a circuit diagram of a read data sensing circuit 51 illustrated in FIG. 3. For clarity of description, the phase change memory cell 20-1 is illustrated together with the data read circuit 50. Referring to FIGS. 3 and 4, the data read circuit 50 includes a read data sensing circuit 51 and a variable current generation circuit 200. The read data sensing circuit 51 includes a clamping circuit 120, a precharge circuit 130, and a sense amplifier 140.

The clamping circuit 120 clamps a voltage level of a bit line BL so that the voltage level of the bit line BL is in an appropriate range for reading. For example, the clamping circuit 120 clamps the voltage level of the bit line BL to a level below a threshold voltage of a phase change material. If the voltage level of the bit line BL is higher than the threshold voltage, the phase of the phase change material of the phase change memory cell 20-1 may change. The clamping circuit 120 connects the bit line BL to a sensing node NA in response to a clamping signal VCMP. For example, the clamping circuit 120 may be implemented by a P-type metal-oxide semiconductor (PMOS) transistor or an N-type metal-oxide semiconductor (NMOS) transistor. The clamping signal VCMP may be DC or AC. For example, the clamping circuit 120 may include a common gate including a gate for receiving the DC or AC clamping signal VCMP.

The precharge circuit 130 precharges the sensing node NA to a threshold voltage level, e.g., a first supply voltage (source) VDD which is externally input, during a precharge operation. As illustrated in FIG. 4, the precharge circuit 130 may be a PMOS transistor which can apply the first supply voltage VDD to the sensing node NA in response to a precharge signal VPRE.

The sense amplifier 140 compares the voltage level of the sensing node NA with a reference voltage level Vref and outputs data DATA corresponding to a comparison result. For example, the sense amplifier 140 may be implemented by a current sense amplifier which can sense the change in current flowing out through the bit line BL0 connected to the selected phase change memory cell 20-1.

The variable current generation circuit 200 connected between the first supply voltage VDD and a ground is enabled in response to an enable signal EN and supplies a variable current Tout, which varies with a change of temperature, to the sensing node NA. The variable current generation circuit 200 may be a current generation circuit having a proportional-to-absolute-temperature (PTAT) characteristic. However, example embodiments of the present invention are not limited thereto. For example, the variable current generation circuit 200 may vary the current Tout in response to other factors, for example, threshold voltage drift, leakage current, etc. Further, example embodiments of the present invention may also supply a variable voltage to the sensing node NA or any other intervening element leading to the sense amplifier 140, where the voltage varies with a change in temperature or another factor, such as those listed above.

Figure 5:
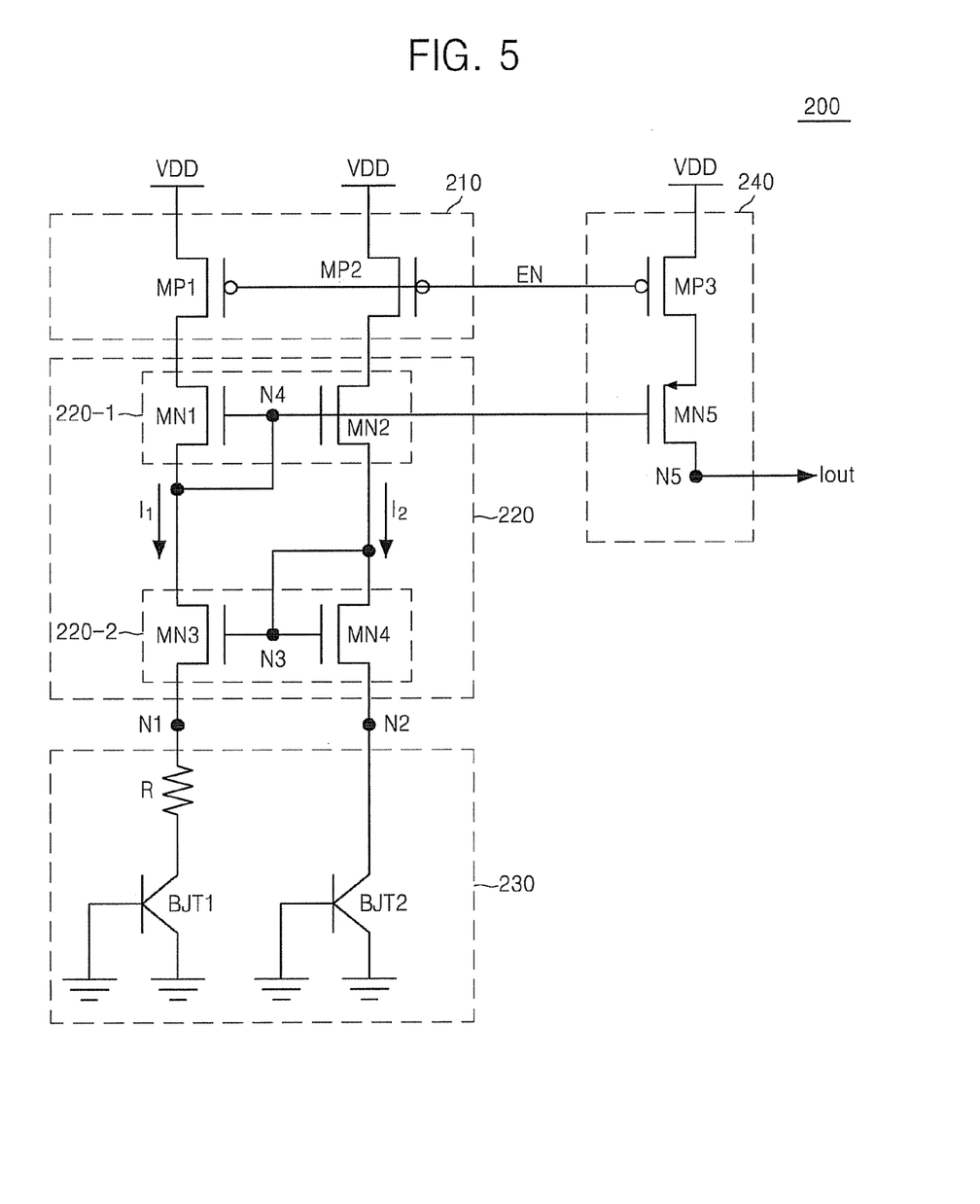
FIG. 5 is a circuit diagram of a variable current generation circuit illustrated in FIG. 3.

FIG. 5 is a circuit diagram of the variable current generation circuit 200 illustrated in FIG. 3. Referring to FIG. 5, the variable current generation circuit 200 includes a power supply unit 210, a current mirror unit 220, a level control unit 230, and an output unit 240. The power supply unit 210 includes a first PMOS transistor MP1 and a second PMOS transistor MP2. The first and second PMOS transistors MP1 and MP2 provide the first supply voltage VDD to the current mirror unit 220 according to a level of the enable signal EN applied to gates of the first and second PMOS transistors MP1 and MP2.

The current mirror unit 220 includes a plurality of NMOS transistors MN1 through MN4. The current mirror unit 220 is connected between the power supply unit 210 and the level control unit 230, receives the first supply voltage VDD from the power supply unit 210, and mirrors a first current I1 flowing in a first node N1 to a second current I2 flowing in a second node N2.

For example, the current mirror unit 220 includes a first current mirror 220-1 and a second current mirror 220-2. The first current mirror 220-1 includes a plurality of NMOS transistors MN1 and MN2. Each gate (or common node) N4 of the NMOS transistors MN1 and MN2 is connected to a branch in which the first current Ti flows. The NMOS transistors MN1 and MN2 may have the same channel width/channel length or different channel widths/channel lengths. The second current mirror 220-2 includes a plurality of NMOS transistors MN3 and MN4. Each gate (or common node) N3 of the NMOS transistors MN3 and MN4 is connected to a branch in which the second current I2 flows. The NMOS transistors MN3 and MN4 may have the same channel width/channel length or different channel widths/channel lengths.

The level control unit 230 is connected to the first node N1, the second node N2, and a second supply source (e.g., a ground voltage source). The level control unit 230 includes a resistor R, a first transistor BJT1, and a second transistor BJT2. Each of the first and second transistors BJT1 and BJT2 may be implemented by a bipolar junction transistor (BJT). For example, when a current flowing in the first transistor BJT1 via the resistor R is M (where M is a natural number) times greater than a current flowing in the second transistor BJT2, the current driving performance of the second transistor BJT2 may be M times greater than that of the first transistor BJT1 to equalize the first current I1 to the second current I2.

The output unit 240 includes a plurality of MOS transistors MP3 and MN5 connected in series between the first supply voltage VDD and a node N5. In the output unit 240, the PMOS transistor MP3 is turned on or off in response to the enable signal EN and the NMOS transistor MN5 outputs a current mirrored by the current mirror unit 220, e.g., the first current I1 or the second current I2, to the sensing node NA as the output current Iout. For example, the transistor MN5 is turned on or off in response to a current at the common node N4.

Figure 6:
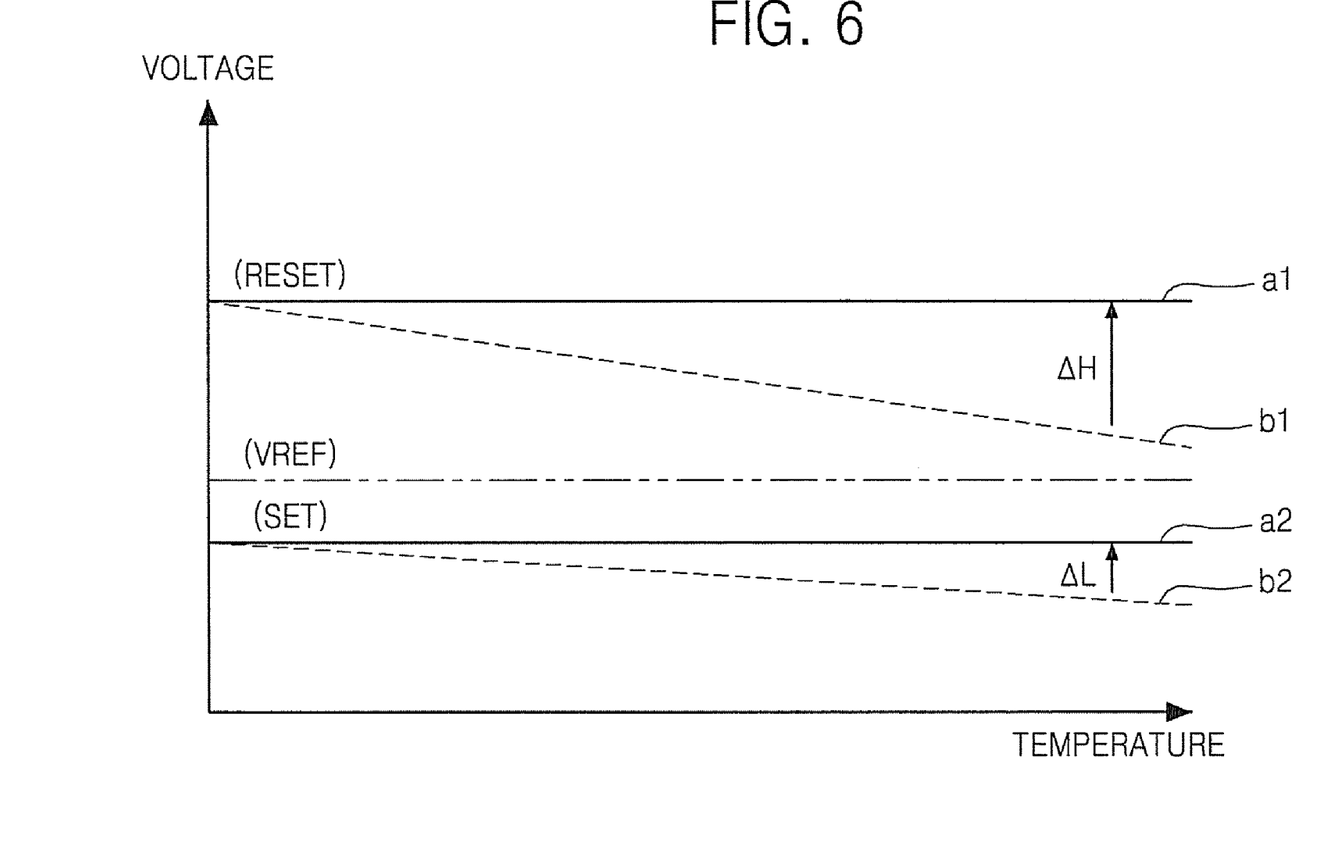
FIG. 6 is a graph of the change in a voltage level of a sensing node with respect to external temperature.

FIG. 6 is a graph of the change in the voltage level of the sensing node NA with respect to an external temperature. The X-axis is the external temperature and the Y-axis is the voltage level of the sensing node NA. A line a1 shows the voltage level of the sensing node NA in a reset state (RESET) at normal room temperature and a line a2 shows the voltage level of the sensing node NA in a set state (SET) at the normal room temperature. Lines h1 and b2 show the voltage level of the sensing node NA in the reset state and the voltage level of the sensing node NA in the set state, respectively, at a temperature higher than the normal room temperature.

As the external temperature increases, a margin between the voltage level of the sensing node NA in the set state and the voltage level of the sensing node NA in the reset state decreases. Accordingly, the sense amplifier 140 may not clearly distinguish between the set state and the reset state and may erroneously sense the reset state as the set state.

To prevent or reduce such a phenomenon, according to example embodiments of the present invention, the variable current generation circuit 200 provides a variable current to the sensing node NA according to the change in the external temperature during a read operation, so that the current of the sensing node NA is supplemented. Accordingly, the sense amplifier 140 can sense a voltage difference ΔH between the voltage level of the sensing node NA in the reset state and the reference voltage level Vref or a voltage difference ΔL between the voltage level of the sensing node NA in the set state and the reference voltage level Vref.

Consequently, the data read circuit 50 secures a margin between a voltage level of the sensing node NA in the reset state and a voltage level of the sensing node NA in the set state, thereby reducing the erroneous operation of the sense amplifier 140. As a result, the reliability of the phase change memory device 100 is increased.

Figure 7:
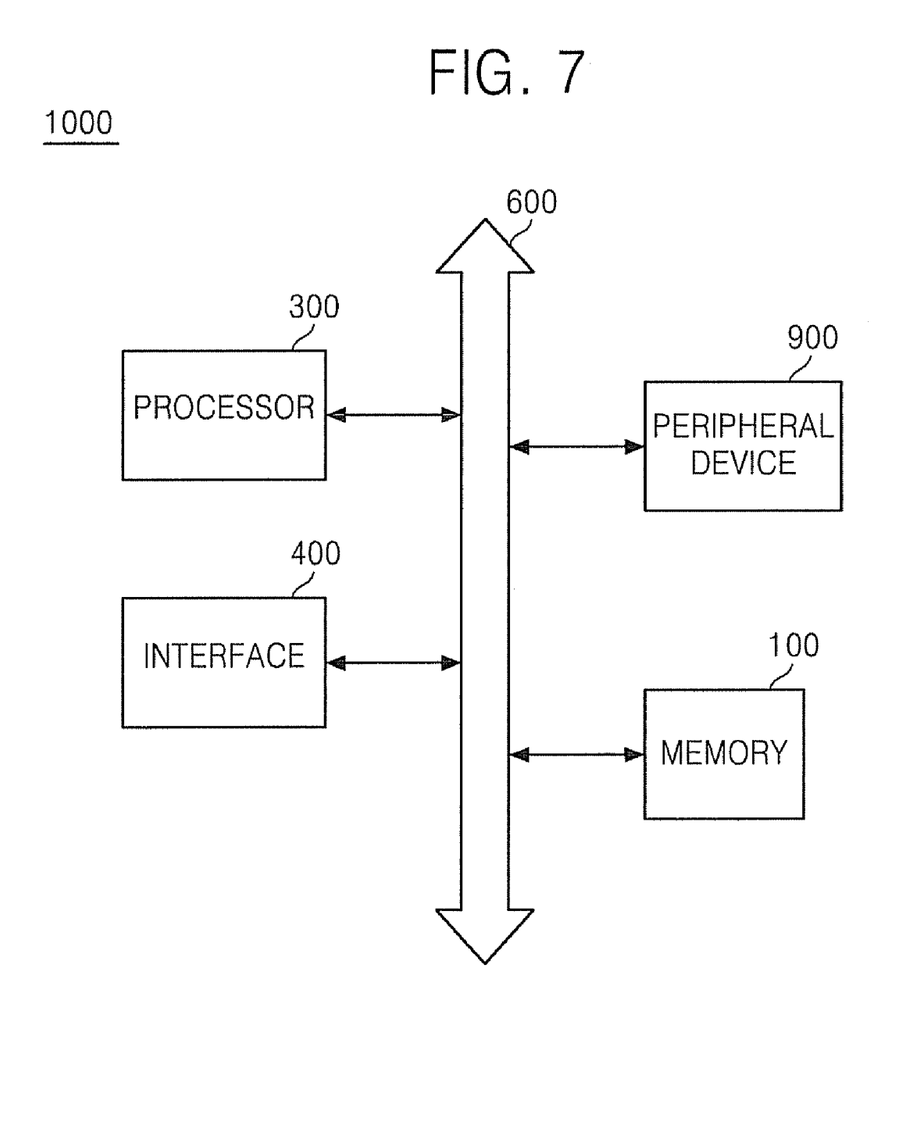
FIG. 7 is a block diagram of a memory system including the semiconductor memory device illustrated in FIG. 2 according to example embodiments of the present invention.
Figure 8:
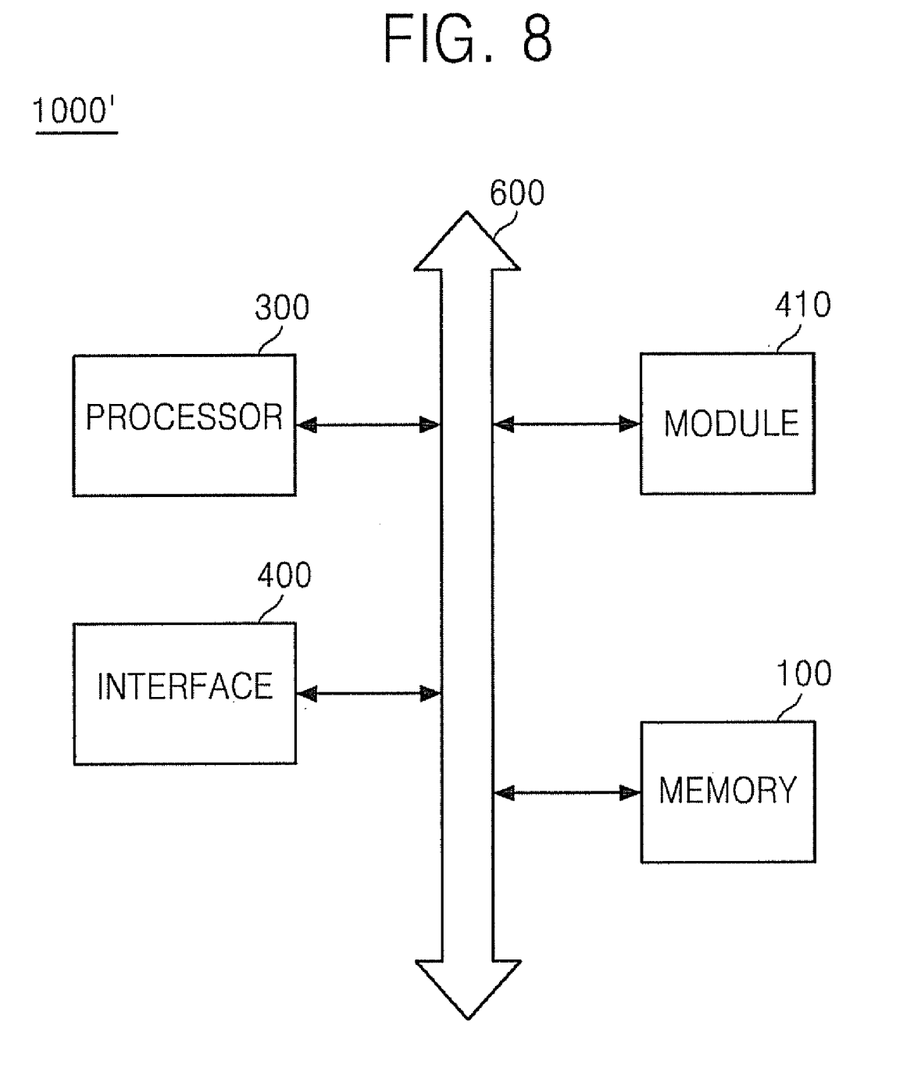
FIG. 8 is another block diagram of a memory system including the semiconductor memory device illustrated in FIG. 3 according to example embodiments of the present invention.

FIG. 7 is a block diagram of a memory system 1000 including the phase change memory device 100 according to example embodiments of the present invention. FIG. 8 is a block diagram of a memory system 1000' including the phase change memory device 100 according to example embodiments of the present invention.

Referring to FIG. 7 the memory system 1000 includes the phase change memory device 100 shown in FIG. 1 and the processor 300. The phase change memory device 100 may include a plurality of non-volatile memory cells.

The processor 300 may control the operation, e.g., the write or the read operation, of the phase change memory device 100 shown in FIG. 1. For instance, the processor 300 may control an operation in which data input through an interface 400, such as from an input/output device, is processed and the processed data is written to the phase change memory device 100 or an operation in which data read from the phase change memory device 100 is processed and the processed data is transmitted externally through the interface 400.

The memory system 1000 may also include a peripheral device 900 such as an image pick-up device. The image pick-up device 900 may be a complementary metal-oxide semiconductor (CMOS) image sensor or a charge coupled device (CCD) image sensor. The image pick-up device 900 may convert a picked-up optical image signal into a digital image signal and store the digital image signal in the phase change memory device 100 through a bus 600 in compliance with the processor 300.

The interface 400 may be implemented by a secure digital (SD) card interface or a multi media card (MMC) interface. Accordingly, an external host can communicate data with the phase change memory device 100 through the interface 400 in compliance with the processor 300.

Referring to FIG. 8, the memory system 1000' may include a communication module 410 instead of the image pick-up device 900 compared to the memory system 1000 illustrated in FIG. 7. The communication module 410 may communicate data with an external device according to a signal processing protocol of the communication module 410 that is in compliance with the processor 300. The communication module 410 may also store externally received data in the phase change memory device 100 or transmit the data to other devices through the interface 400 in compliance with the processor 300.

The memory system 1000 illustrated in FIG. 7 or the memory system 1000' illustrated in FIG. 8 may be implemented by a computer, a handheld terminal, or consumer equipment (CE) in some embodiments of the present invention. The memory system 1000 or 1000' may be implemented by a memory card, a smart card, or a solid state drive (SSD) in other embodiments of the present invention. The handheld terminal may be a cellular telephone, a smart phone, a personal digital assistant (PDA), a portable multimedia player (PMP), MP3 player, or a game console. The memory system 1000 or 1000' may be a computing system or a motile device in still other embodiments of the present invention. In yet other embodiments of the present invention, the memory system 100 or 1000' may be implemented by a high-definition television (HDTV), a digital video disc (DVD) player, a router, or a home application.

As described above, according to example embodiments of the present invention, a data read circuit increases or decreases a read current according to an external temperature, thereby securing a margin between a set state and a reset state with respect to the change in the external temperature. As a result, the data read circuit reduces the erroneous operation of a sense amplifier with respect to the change in the external temperature and increases the reliability of a phase change memory device performing a read operation.

While example embodiments of the present invention have been particularly shown and described with reference to example embodiments thereof, it will be understood by those of ordinary skill in the art that various changes in forms and details may be made therein without departing from the spirit and scope of example embodiments of the present invention as defined by the following claims.

What is claimed is:

1. A data read circuit comprising:
    a variable current generation circuit configured to generate a variable current that varies in response to an external temperature, the variable current being used to read data of only a non-reference memory cell, and the variable current supplementing a current at a sensing node of the data read circuit; and
    a data sensing circuit configured to sense and amplify data on a bit line connected to a non-volatile memory cell according to the variable current and to configured to output the sensed and amplified data,
    wherein the data sensing circuit controls a margin for sensing the data according to the variable current.

2. The data read circuit of claim 1, wherein the variable current generation circuit is configured to generate the variable current in proportion to the external temperature.

3. The data read circuit of claim 1, wherein the data sensing circuit comprises: a clamping circuit connected between the bit line and the sensing node to provide a clamping voltage to the bit line in response to a clamp signal, the clamping voltage having a threshold voltage level; and
    a sense amplifier configured to compare a voltage level of the sensing node with a reference voltage level and configured to sense and amplify the data on the bit line.

4. The data read circuit of claim 3, wherein the variable current generation circuit provides the variable current to the sensing node during a read operation such that the sense amplifier secures the margin for sensing the data between a voltage level of the sensing node in a reset state and a voltage level of the sensing node in a set state.

5. The data read circuit of claim 4, wherein the sense amplifier is configured to sense at least one of a voltage difference between the voltage level of the sensing node in the reset state and the reference voltage level and a voltage difference between the voltage level of the sensing node in the set state and the reference voltage level.

6. The data read circuit of claim 4, further comprising:
a precharge circuit configured to charge the sensing node to a precharge voltage level during a precharge operation preceding the read operation.

7. The data read circuit of claim 3, wherein the clamping circuit includes a transistor.

8. The data read circuit of claim 1, wherein the non-volatile memory cell includes at least one phase change memory cell.

9. A semiconductor device comprising:
a non-volatile memory cell connected to a word line and a bit line; and
a data read circuit configured to read data on the bit line, wherein
the data read circuit includes,
    a variable current generation circuit configured to generate a variable current that varies in response to an external temperature, the variable current being used to read data of only a non-reference memory cell, and the variable current supplementing a current at a sensing node of the data read circuit, and
    a data sensing circuit configured to sense and amplify the data on the bit line connected to the non-volatile memory cell according to the variable current and configured to output the sensed and amplified data, and
the data sensing circuit controls a margin for sensing the data according to the variable current.

10. The semiconductor device of claim 9, wherein the variable current generation circuit is configured to generate the variable current in proportion to the external temperature.

11. The semiconductor device of claim 9, wherein the data sensing circuit comprises:
a clamping circuit connected between the bit line and the sensing node to provide a clamping voltage to the bit line in response to a clamp signal, the clamping voltage having a threshold voltage level; and
a sense amplifier configured to compare a voltage level of the sensing node with a reference voltage level and configured to sense and amplify the data on the bit line.

12. The semiconductor device of claim 11, wherein the variable current generation circuit provides the variable current to the sensing node during a read operation such that the sense amplifier secures the margin for sensing the data between a voltage level of the sensing node in a reset state and a voltage level of the sensing node in a set state.

13. The semiconductor device of claim 12, wherein the sense amplifier is configured to sense at least one of a voltage difference between the voltage level of the sensing node in the reset state and the reference voltage level and a voltage difference between the voltage level of the sensing node in the set state and the reference voltage level.

14. The semiconductor device of claim 12, further comprising:
a precharge circuit configured to charge the sensing node to a precharge voltage level during a precharge operation preceding the read operation.

15. A semiconductor memory system comprising:
a semiconductor device; and
a processor configured to control operations of the semiconductor device, wherein the semiconductor device includes,
a non-volatile memory cell connected to a word line and a bit line, and
a data read circuit configured to read data on the bit line, the data read circuit includes,
a variable current generation circuit configured to generate a variable current that varies in response to an external temperature, the variable current being used to read data of only a non-reference memory cell, and the variable current supplementing a current at a sensing node of the data read circuit, and
a data sensing circuit configured to sense and amplify the data on the bit line connected to the non-volatile memory cell according to the variable current and configured to output the sensed and amplified data, and the data sensing circuit controls a margin for sensing the data according to the variable current.

16. The semiconductor memory system of claim 15, further comprising:
an image sensor configured to convert an optical signal into a digital data signal, wherein
the processor is configured to store the digital data signal in the non-volatile memory cell included in the semiconductor device.

17. The semiconductor memory system of claim 15, further comprising:
a card interface, wherein
the processor is configured to control the sensed and amplified data output from the data sensing circuit to be transmitted externally through the card interface.

18. The semiconductor memory system of claim 15, wherein the data sensing circuit comprises:
a clamping circuit connected between the bit line and the sensing node to provide a clamping voltage to the bit line in response to a clamp signal, the clamping voltage having a threshold voltage level; and
a sense amplifier configured to compare a voltage level of the sensing node with a reference voltage level and configured to sense and amplify the data on the bit line.

19. The semiconductor memory system of claim 18, wherein the variable current generation circuit provides the variable current to the sensing node during a read operation such that the sense amplifier secures the margin for sensing the data between a voltage level of the sensing node in a reset state and a voltage level of the sensing node in a set state.

20. The semiconductor memory system of claim 19, wherein the sense amplifier is configured to sense at least one of a voltage difference between the voltage level of the sensing node in the reset state and the reference voltage level and a voltage difference between the voltage level of the sensing node in the set state and the reference voltage level.

* * * * *